United States Patent
Moore

(10) Patent No.: US 11,146,270 B2
(45) Date of Patent: Oct. 12, 2021

(54) PROXIMITY SENSOR AND METHOD OF OPERATING A PHOTODETECTOR BASED PROXIMITY SENSOR

(71) Applicant: STMicroelectronics (Research & Development) Limited, Buckinghamshire (GB)

(72) Inventor: John Kevin Moore, Edinburgh (GB)

(73) Assignee: STMICROELECTRONICS (RESEARCH & DEVELOPMENT) LIMITED, Buckinghamshire (GB)

( * ) Notice: Subject to any disclaimer, the term of this patent is extended or adjusted under 35 U.S.C. 154(b) by 171 days.

(21) Appl. No.: 16/535,369

(22) Filed: Aug. 8, 2019

(65) Prior Publication Data
US 2020/0052694 A1 Feb. 13, 2020

(30) Foreign Application Priority Data
Aug. 13, 2018 (EP) .................... 18188750

(51) Int. Cl.
*H03K 17/94* (2006.01)
*H01L 31/0232* (2014.01)
(Continued)

(52) U.S. Cl.
CPC ..... *H03K 17/943* (2013.01); *H01L 31/02327* (2013.01); *H01L 31/125* (2013.01); *H03K 17/945* (2013.01)

(58) Field of Classification Search
CPC ................ H03K 17/943; H03K 17/945; H01L 31/02327; H01L 31/125
(Continued)

(56) References Cited

U.S. PATENT DOCUMENTS

2013/0284940 A1 10/2013 Herrmann et al.
2014/0070867 A1 3/2014 Dutton
(Continued)

FOREIGN PATENT DOCUMENTS

CN 103314307 A 9/2013
CN 211553064 U 9/2020
(Continued)

OTHER PUBLICATIONS

Gnecchi, Salvatore, et al., "A Simulation Model for Digital Silicon Photomultipliers", Jun. 2106, IEEE Transactions on Nuclear Science, vol. 63 No. 3, 1343-1350. (Year: 2016).*
(Continued)

*Primary Examiner* — Tomi Skibinski
(74) *Attorney, Agent, or Firm* — Slater Matsil, LLP

(57) ABSTRACT

An apparatus can be used for detecting pile-up within circuitry associated with photodetectors. The apparatus includes an input terminal configured to receive a plurality of photodetector outputs. An OR-tree is coupled in parallel with the circuitry associated with the photodetectors. The OR-tree has an input coupled to the input terminal and is configured to combine the photodetector outputs. A counter is configured to count an output of the OR-tree. A comparator is configured to compare an output of the counter to a determined threshold value, wherein the comparator is configured to output an indicator indicating pile-up within the circuitry associated with photodetectors based on the output of the counter being greater than or equal to the determined threshold value.

20 Claims, 8 Drawing Sheets

(51) Int. Cl.
*H01L 31/12* (2006.01)
*H03K 17/945* (2006.01)

(58) Field of Classification Search
USPC .......................................................... 324/658
See application file for complete search history.

(56) References Cited

U.S. PATENT DOCUMENTS

2019/0015038 A1\* 1/2019 Finkelstein ........... G01J 1/0238
2020/0052694 A1   2/2020 Moore
2020/0386901 A1   12/2020 Furumiya

FOREIGN PATENT DOCUMENTS

WO    2017216378 A1   12/2017
WO    2018123112 A1   7/2018

OTHER PUBLICATIONS

Gnecchi, Salvatore, et al., "A Simulation Model for Digital Silicon Photomultipliers", IEEE Transactions on Nuclear Science, vol. 63, No. 3, Jun. 2016, pp. 1343-1350.

\* cited by examiner

PROXIMITY SENSOR AND METHOD OF OPERATING A PHOTODETECTOR BASED PROXIMITY SENSOR

CROSS-REFERENCE TO RELATED APPLICATIONS

This application claims priority to European Patent Application No. 18188750.6, filed on Aug. 13, 2018, which application is hereby incorporated herein by reference.

TECHNICAL FIELD

The present disclosure relates to a photodetector based proximity sensor and a method of operating a photodetector based proximity sensor.

BACKGROUND

Existing single photon avalanche diodes (SPADs) are based on a PN junction. The PN junction is reverse biased at a voltage exceeding a breakdown voltage by an excess bias voltage. In this way, a carrier generated by a single photon can be injected into a depletion region and can cause a self-sustaining avalanche. The SPAD may be quenched allowing the PN junction to be reset to detect further photons.

SUMMARY

According to one aspect, an apparatus for detecting pile-up within circuitry associated with photodetectors comprises an input configured to receive one or more photodetector outputs. The input is coupled to the circuitry associated with the photodetectors. An OR-tree is in parallel with the circuitry. The input to the OR-tree is in parallel with the circuitry coupled to the input and configured to combine the one or more photodetector outputs. A counter is configured to count an output of the OR-tree in parallel with the circuitry. A comparator is configured to compare the output of the counter to a determined threshold value. The comparator is configured to output an indicator indicating pile-up within the circuitry associated with photodetectors based on the output of the counter being greater than or equal to the determined threshold value.

The one or more photodetector outputs may comprise one or more avalanche diodes configured to generate a pulse on detecting a photon and one or more comparators. Each comparator is associated with an avalanche diode and configured to sharpen a pulse generated by the associated avalanche diode.

The circuitry associated with the photodetectors may comprise: one or more pulse shapers configured to shorten a pulse width of the one or more photodetector outputs; and an OR-tree configured to combine outputs of the one or more pulse shapers.

The apparatus may further comprise a histogram determiner configured to generate count bin values for a histogram; a histogram processor configured to receive the count bin values and an output of the comparator, wherein the histogram processor may be configured to: generate a distance based on a the count bin values when the output of the comparator indicates an absence of pile-up within the circuitry associated with photodetectors; or generate an indication that a distance based on the count bin levels is inaccurate when the output of the comparator indicates pile-up within the circuitry associated with photodetectors.

The photodetectors may be single photon avalanche diodes.

According to a second aspect there is provided a method for detecting pile-up within circuitry associated with photodetectors, the method comprising: receiving one or more photodetector outputs at the circuitry associated with the photodetectors; combining the one or more photodetector outputs in parallel with the circuitry; counting the combining of the one or more photodetector outputs in parallel with the circuitry; comparing the counting of the combining of the one or more photodetector outputs in parallel with the circuitry to a determined threshold value; and generating an indicator based on the comparing, wherein the indicator is configured to indicate pile-up within the circuitry associated with photodetectors when counting of the combining of the one or more photodetector outputs in parallel with the circuitry is greater than or equal to the determined threshold value.

Receiving one or more photodetector outputs at the circuitry associated with the photodetectors may comprise: receiving outputs from one or more avalanche diodes configured to generate a pulse on detecting a photon; receiving outputs from one or more comparators, each comparator associated with an avalanche diode and configured to sharpen a pulse generated by an associated avalanche diode.

The method may further comprise providing the circuitry associated with the photodetectors, wherein the circuitry associated with the photodetectors may comprise: one or more pulse shapers configured to shorten a pulse width of the one or more photodetector outputs; and an OR-tree configured to combine outputs of the one or more pulse shapers.

The method may further comprise: generating count bin values for a histogram from the circuitry associated with the photodetectors; generating a distance based on the count bin values when the indicator based on the comparing indicates an absence of pile-up within the circuitry associated with photodetectors.

The method may further comprise: generating count bin values for a histogram from the circuitry associated with the photodetectors; generating an indication that a distance based on the count bin levels is inaccurate when the output of the comparator indicates pile-up within the circuitry associated with photodetectors.

The photodetectors may be single photon avalanche diodes.

According to a third aspect there is provided an apparatus for detecting pile-up within circuitry associated with photodetectors, the apparatus comprising: means for receiving one or more photodetector outputs, the input coupled to the circuitry associated with the photodetectors; means for combining of the one or more photodetector outputs in parallel with the circuitry; means for counting the combining of the one or more photodetector outputs in parallel with the circuitry; means for comparing the means for counting to a determined threshold value; means for generating an indicator based on the means for comparing, wherein the indicator is configured to indicate pile-up within the circuitry associated with photodetectors when the means for counting of the combining of the one or more photodetector outputs in parallel with the circuitry is greater than or equal to the determined threshold value.

The circuitry associated with the photodetectors may comprise: means for shortening a pulse width of the one or more photodetector outputs; and means for combining outputs of the means for shortening a pulse width.

The apparatus may further comprise: means for generating count bin values for a histogram from the circuitry associated with the photodetectors; and means for generating a distance based on a the count bin values when the indicator based on the comparing indicates an absence of pile-up within the circuitry associated with photodetectors.

The apparatus may further comprise: means for generating count bin values for a histogram from the circuitry associated with the photodetectors; and means for generating an indication that a distance based on the count bin levels is inaccurate when the output of the comparator indicates pile-up within the circuitry associated with photodetectors.

BRIEF DESCRIPTION OF THE DRAWINGS

Reference will now be made, by way of example only, to the accompanying drawings in which:

FIG. 1C shows a flow diagram of the operations of the system shown in FIG. 1a;

DETAILED DESCRIPTION OF ILLUSTRATIVE EMBODIMENTS

Figure 1A:
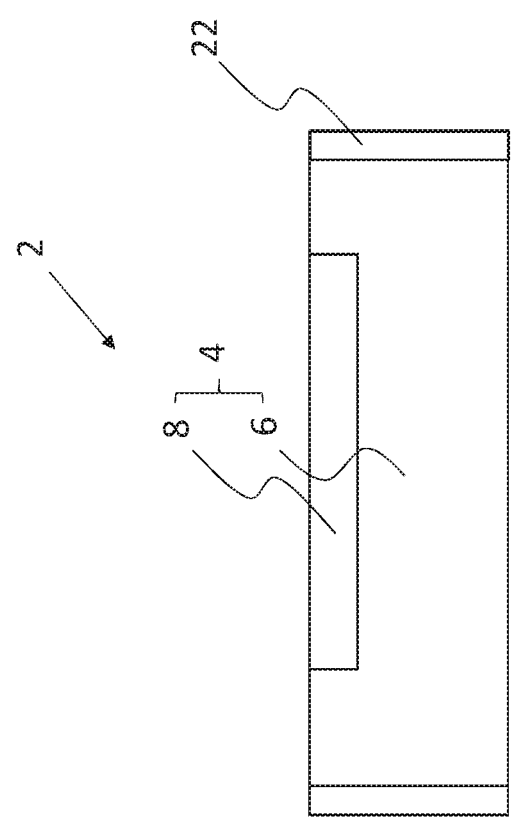
FIG. 1A shows schematically a cross-section of an avalanche diode.

A diode is an electrical device allowing current to move through it in one direction with far greater ease than in the other. The most common kind of diode in modern circuit design is the semiconductor diode and is based on a PN junction.

A PN junction includes a P region (i.e., region doped with a P dopant) and an N region (i.e., region doped with an N dopant type). The N region contains electrons in excess while the P region contains holes in excess. When the PN junction is formed holes are naturally diffused from the P region to the N region and recombined with electrons. Likewise, electrons are naturally diffused from the N region to the P region and are recombined with holes. In this way, a depletion region with pairs of recombined holes and electrons is formed at the interface (i.e., the junction) of the P region and the N region.

The diffusion of holes from the P region leaves negative acceptor ions in the P region while the diffusion of electrons from the N region leaves positive donor ions in the N region. This creates a depletion region electric field that provides a force opposing the continued diffusion of holes and electrons. When the depletion region electric field is sufficiently high the diffusion of holes and electrons is interrupted and the depletion region reaches equilibrium.

The width of the depletion region depends on the concentration of holes in the P region, the concentration of electrons in the N region and a voltage supply applied to the PN junction.

When the voltage supply is a forward bias voltage supply, the P region is connected with a positive terminal of the voltage supply and the N region is connected with a negative terminal of the voltage supply. In this way, the holes in the P region and the electrons in the N region are pushed toward the interface of the P region and the N region. The width of the depletion region decreases.

When the voltage supply is a reverse bias voltage supply, the P region is connected with a negative terminal of the voltage supply and the N region is connected with a positive terminal of the voltage supply. In this way, the holes in the P region and the electrons in the N region are pushed away from the interface of the P region and the N region. The width of the depletion region increases.

The width of the depletion region increases with the increase in reverse bias voltage supply up to a voltage. If the reverse bias voltage supply is increased beyond that voltage, the junction breaks down and allows a reverse current. At this point, a small increase in the voltage will rapidly increase the reverse current. The voltage at which the PN junction breaks down occurs is known as the "breakdown voltage."

The depletion region breakdown may be caused by two mechanisms: Zener breakdown and avalanche breakdown.

In avalanche breakdown, when the reverse voltage supply exceeds the breakdown voltage, electrons diffused in the depletion region are accelerated. The electrons collide with atoms and free bound electrons. Some of these electrons recombine with holes. Others are accelerated in the depletion region, collide with atoms and free further bound electrons, and so on. Likewise, holes diffused in the depletion region area are accelerated in the opposite direction and initiate a similar process. In this way, a self-sustaining avalanche is created and the reverse current increases.

An avalanche diode, such as a single photon avalanche detector (SPAD), follows the above principle. The PN junction is reverse biased at a voltage exceeding the breakdown voltage. When a photon with sufficient energy is absorbed, a bound electron is freed in the depletion region. The electron is accelerated, collides with atoms and frees further bound electrons. Some of these electrons recombine with holes. Others are accelerated, collide with atoms and free further bound electron, and so on. Likewise, holes diffused in the depletion region area are accelerated in the opposite direction and initiate a similar process. In this way, a self-sustaining avalanche is created and the reverse current increases. The avalanche can be stopped by setting the reverse bias voltage supply below the breakdown voltage.

FIG. 1A represents an avalanche diode 2, for example, a single photon avalanche diode (SPAD).

The avalanche diode 2 comprises a PN junction 4 including a P region 6 (i.e., a region doped with a P dopant) and an N region 8 (i.e., a region doped with an N dopant). In an implementation, the P region 6 is an epitaxial layer of P dopant type grown on a Silicon substrate (not represented) and the N region 8 is a well of N dopant type formed within the epitaxial layer. Here, the N region 8 is centered (i.e., aligned with a central longitudinal axis). The PN junction 4 comprises a depletion region (also known as depletion layer or depletion zone) that is naturally formed at the interface (i.e., junction) of the P region 6 and the N region 8 as described above.

The avalanche diode 2 comprises an anode (not represented) connecting the P region 6 to a negative terminal of a voltage supply 10 and a cathode (not represented) connecting the N region 8 to a positive terminal of the voltage supply 12.

The avalanche diode 2 may advantageously comprise a trench isolation region 22 surrounding the PN junction 4 to prevent current leakage from/toward adjacent semiconductor device components. The trench isolation region 22 is for example, made of Silicon Dioxide ($SiO_2$).

The avalanche diode 2 shown in FIG. 1A may be a back side illuminated avalanche diode so that the amount of light captured can be increased and low-light performance can be improved. As discussed above, when a photon with sufficient energy is absorbed via the back side, a bound electron is freed in the depletion region, accelerated, collides with atoms and free further bound electrons. Some of these electrons recombine with holes. Others are accelerated in, collide with atoms and free further bound electrons, and so on.

Figure 1B:
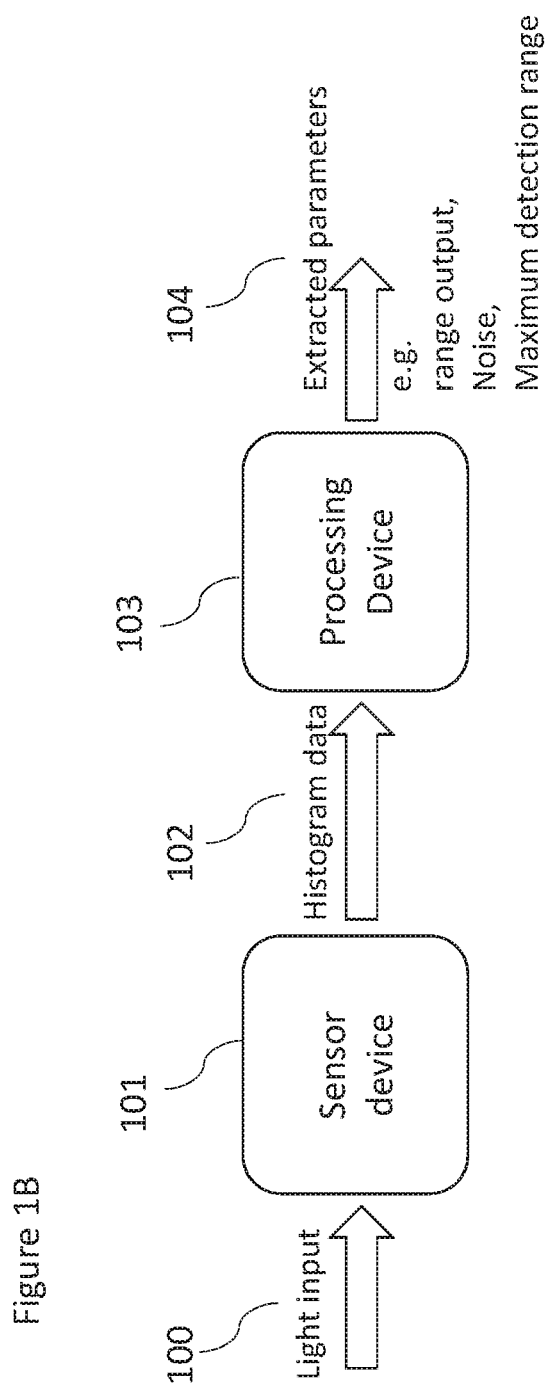
FIG. 1B shows schematically a system according to some embodiments comprising the sensor device comprising an avalanche diode and co-processor configured to determine a range from the sensor to an object.

In FIG. 1B a schematic view of an example system comprising a sensor device comprising an avalanche diode as shown in FIG. 1a and a processing device is shown. In the example shown in FIG. 1B the system comprises a sensor device 101 which comprises the avalanche diode and is configured to receive a light input 100 and is configured to output 'raw' histogram data 102 which is passed to the processing device 103. Furthermore the system comprises a processing device 103 which is configured to receive the 'raw' histogram data and processes the 'raw' histogram data 102 to extract or generate suitable parameters such as a distance or range output 104 representing the distance between the sensor device and an object within the 'field-of-view' of the sensor device.

The sensor device 101 may comprise a light source (such as a vertical cavity surface emitting laser VCSEL or light emitting diode LED), a suitable light source driver, an array of single photon avalanche diode (SPAD) elements and a histogram generator configured to output the 'raw' histogram data representing photon event detection counts for a number of time bins. The histogram data 102 may be passed to the processing device 103. However other configurations may be implemented such as the sensor device comprising a light source, light source driver+a fast photodiode detector with steered charge, an analogue to digital converter (ADC) etc.

The sensor device 101 may for example, comprise a generator/driver configured to provide a periodic electric signal (the periodic signal may for example, be a square shaped signal or a sine shaped signal or any suitable periodic signal). The generator/driver may furthermore power the light source thus generating a 'modulated' light output.

An example of a light source may be a light emitting diode, or any known lighting device, for example, a laser diode. The signal coming out of the light source is transmitted towards an object and is reflected by the object.

The reflected light signal is detected by a light sensor which in the following examples is an array of SPADs (avalanche diodes) also called Geiger mode avalanche photodiodes.

Such detection elements as discussed above may also be rapid charge transfer photodiodes. The signal output by the sensor is thus phase-shifted from the signal provided by the generator/driver by an angle which correlates with the distance to the object.

A histogram generator may be configured to receive the signals generated by the sensor and pass these through pulse shaping circuitry and an OR-tree to generate events which may be counted within digital counters. For example, with a periodic pulsed system, the detected event arrival times may be quantized to build up histogram data which may be post processed to identify the position/distance of multiple targets within the Field of View.

Figure 1C:
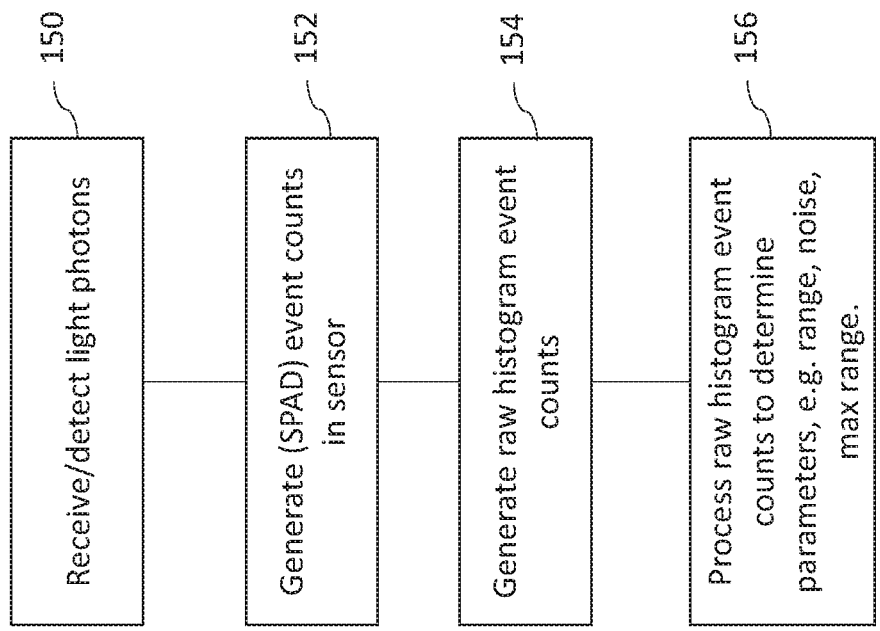

The integration of the processing device 103 and the sensor device 101 may for example, be shown by the flow diagram shown in FIG. 1c wherein the operations of the system as shown in FIG. 1b are described.

Thus for example, the method is shown wherein the light photons are received or detected. The operation of receiving/detecting the photons is shown in FIG. 1c by step 150.

Then the sensor device may be configured to generate (SPAD) detected event counts. The operation of generating the (SPAD) event counts is shown in FIG. 1c by step 152.

The raw histogram event counts may furthermore be then generated. The operation of generating the raw histogram event counts is shown in FIG. 1C by step 154.

The raw histogram event counts may then be processed in order to determine parameters such as range, noise, and max detection range. The operation of processing the raw histogram event counts to determine the parameters is shown in FIG. 1c by step 156.

An issue associated with such systems is 'pile-up' within the histogram generator.

Figure 2:
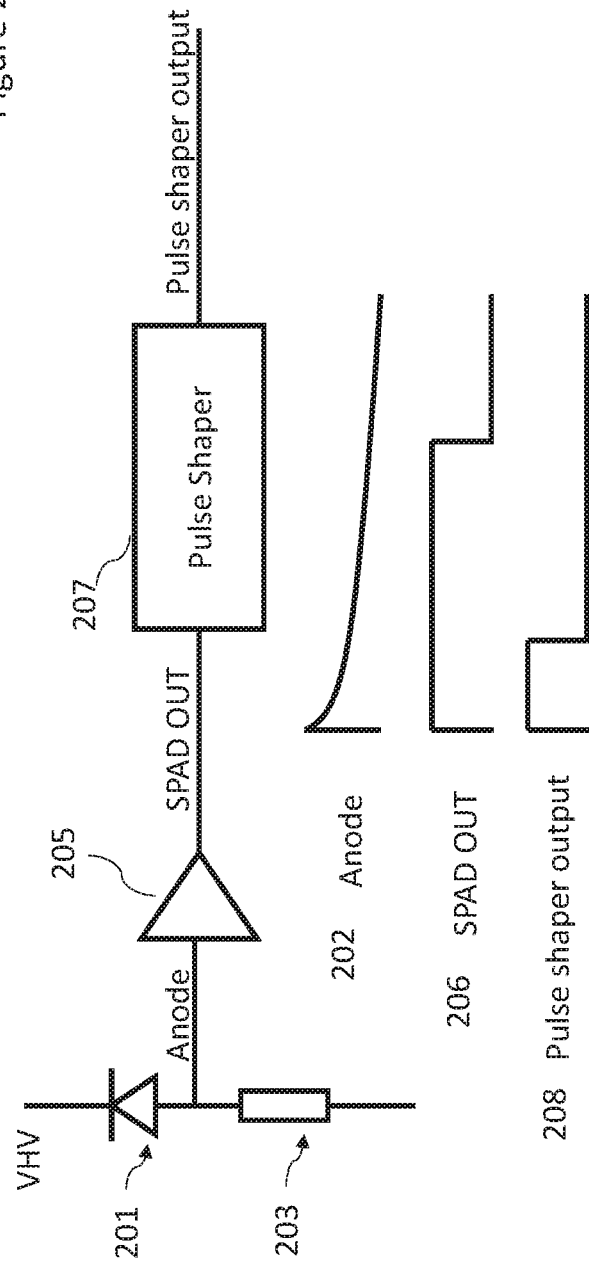
FIG. 2 shows example waveforms generated from the avalanche diode output.
Figure 3:
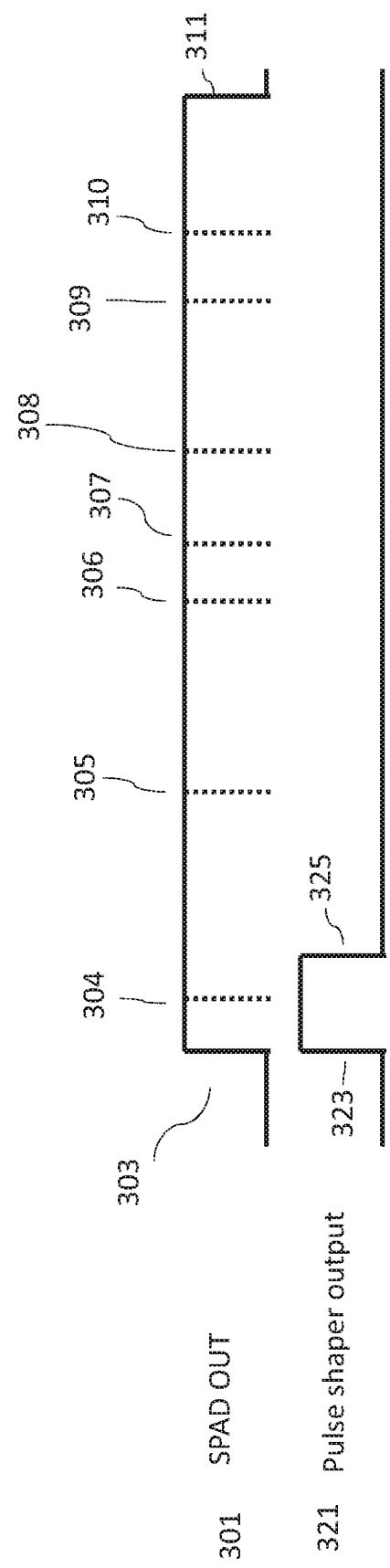
FIG. 3 shows example waveforms illustrating pile-up within the pulse-shaper/OR-tree.

With respect to FIGS. 2 and 3 the effect of 'pile-up' is discussed. Pile-up refers to a situation whereby an illumination of the photodetector is significantly high that the detected events 'pile-up' and therefore the detector is unable to produce accurate results. Pile-up covers two separate effects.

SPAD pile-up is where the SPAD sees many photons in quick succession. This prevents the anode from discharging, and so the output from the circuit is always high. The lack of rising edges then registers by the counter a significantly lower than actual count value.

OR tree pile-up occurs where, with many SPAD+OR trees enabled, the ORed output appears to be a single long pulse with only one rising edge rather than multiple rising edges. As with SPAD pile-up the single lone pulse causes a significantly lower count value to be recorded.

With respect to FIG. 2, an example avalanche diode based detector is shown. FIG. 2 shows the avalanche diode 201 coupled with a cathode connected to the higher reference voltage VHV. The avalanche diode 201 anode is further coupled to an input of a comparator 205 and a bias resistor 203. The bias resistor 203 is furthermore coupled to the lower reference voltage.

The comparator 205 output signal which is passed to a pulse shaper 207. In some embodiments the comparator 205 output signal is passed to an OR-tree (not shown) where the outputs are of the comparator are summed and then passed to the pulse shaper 207. The output of the pulse shaper 207 may then be passed to digital counters to generate the raw histogram output.

The potential at the anode output after photon is absorbed and 'an event' detected is one where the potential is shown by the waveform 202 where a step potential jump is followed by an exponential discharge waveform.

The comparator 205 converts the anode potential into logic high and low levels and effectively generates a square wave output for each event as shown by the waveform 206.

The pulse shaper 207 is configured to improve the dynamic range of the comparator 205 signal by reducing the length of the comparator output signal. This is shown in FIG. 2 by the pulse shaper output 208.

In high ambient light situations avalanche diode events occur frequently. If the situation where the OR-tree sums the output of the comparator, the number of events detected may reach a level that the output of the OR-tree misses individual events and produces a single long pulse rather than many event pulses. This situation for example, is shown in FIG. 3 where output of the OR-tree is shown by waveform 301 which represents the detection or multiple events by the avalanche diodes.

Thus for example, waveform 301 shows the initial event detection by the rising edge 303, however further detected events at times 304, 305, 306, 307, 308, 309 and 310 are missed and the waveform falling edge 311 represents the comparator period after the last event 310 is detected.

The pulse shaper output waveform 321 is also shown whereby the pulse shaper output has a rising edge at time 323 which is substantially the same time at the as the rising edge time 303 and falls at time 325 but due to SPAD pile up, where the SPAD sees many photons in quick succession and the anode cannot discharge, and the SPAD OUT is always high there are no further rising edges and no further pulses generated by the pulse shaper. This produces a pulse shaper output which does not represent the significant number of events detected and produces an output which looks like an output generated by low ambient levels therefore would fail to detect a target.

A situation where this may occur may be when there is high ambient light and/or where the target is reflecting a significant amount of photons and producing high count rates. This is problematic as the output would indicate that the detector is in low light and no target is present even where there is a significant target available and present and is a false and dangerous for safety critical applications result.

An example of such safety critical applications is in automotive applications. Automotive applications, for example, range detection for autonomous or semi-autonomous driving has to consider situations where there may be significant ambient light. Furthermore such applications may only have a few light pulses to determine whether the situation is one produced by a high ambient light level or target reflection.

The concept which is discussed further with respect to the following embodiments is apparatus and methods configured to determine whether the detector is experiencing significant frequency of events which have led to pile-up occurring within the OR-tree (or generally within the histogram generator). The embodiments therefore show apparatus and methods for providing a separate or parallel OR-tree feeding a counter (and without a pulse shaper) which is employed to determine whether the avalanche diodes are 'blinded' from the high ambient light.

Figure 4:
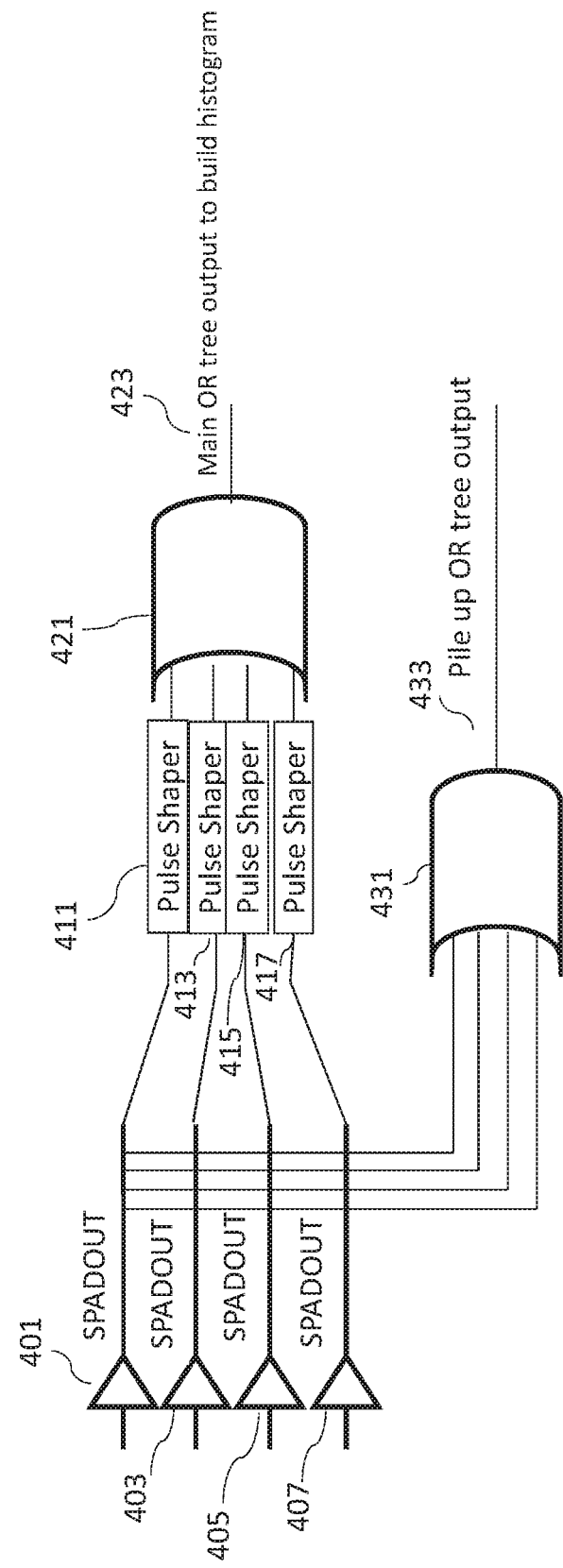
FIG. 4 shows schematically an example apparatus according to some embodiments for determining and indicating the occurrence of pile-up within the pulse-shaper/OR-tree graph.

With respect to FIG. 4 an example apparatus for detecting pile-up occurring within the OR-tree (or generally within the histogram generator) according to some embodiments is shown. In FIG. 4 the apparatus is shown with four avalanche diode comparators 401, 403, 405, 407 outputting signals from four avalanche diodes. However it would be understood that in some embodiments any suitable number of avalanche diodes may be grouped together and in some examples may be defined as a zone or region of avalanche diodes.

The outputs of the comparators 401, 403, 405, 407 are passed to associated pulse shaper circuitry 411, 413, 415, 417. The output of the pulse shaper circuitry is passed to a main or first OR-tree 421. The main OR-tree 421 output 423 may then be passed to a fast time to digital converter (TDC) to generate the raw histograms.

Furthermore the apparatus comprises a pile-up or second OR-tree 431 which is configured to receive the outputs of the comparators. In other words, the pile-up OR-tree 431 receives the signals from the output of the comparators 401, 403, 405, 407 without the pulse-shaper circuitry. The pile-up OR-tree 431 is configured to combine the signals from the comparators and output a combined comparator output 433.

In some embodiments, the output of pile-up OR-tree 431 is coupled to a counter to count the pile-up OR-tree output. The pile-up counter may in some embodiments be compared to a threshold value. This comparison may be used to generate a flag or suitable indicator when the pile-up counter value hits the threshold value and which may be configured to enable the detector to determine whether the zone (or group of the avalanche diodes) is not blinded from high ambient light.

Figure 5:
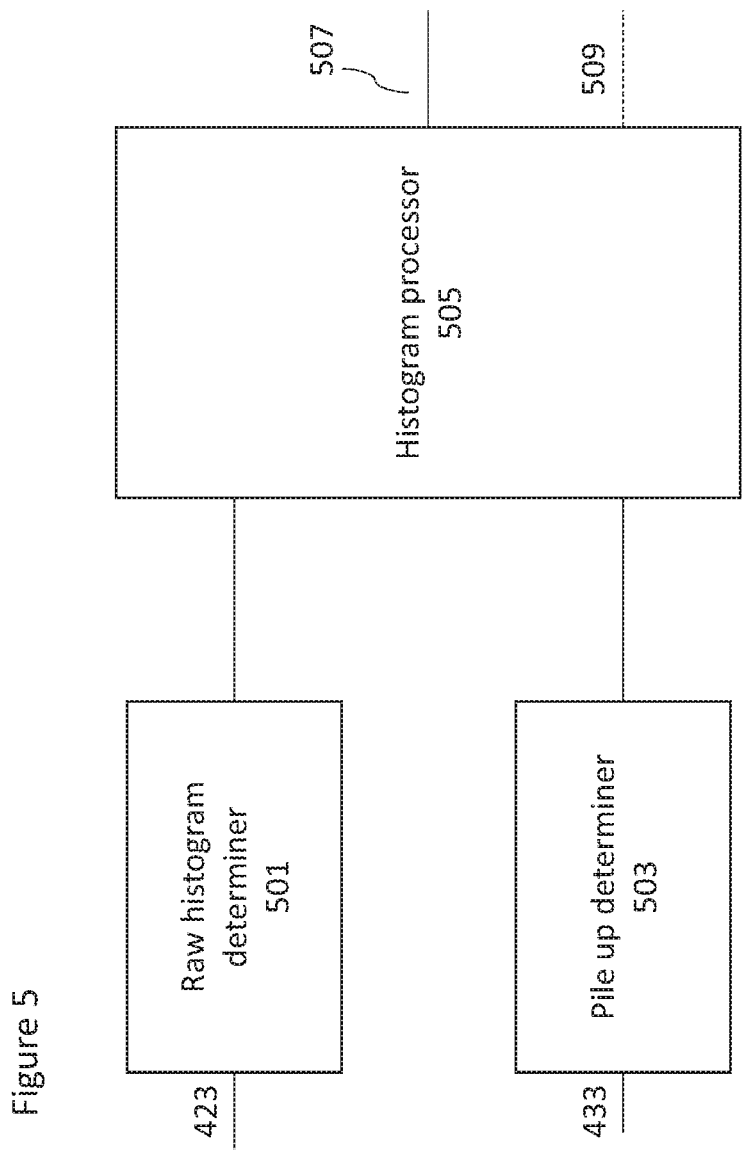
FIG. 5 shows schematically example apparatus according to some embodiments for handling the determination of the occurrence of pile-up within the pulse-shaper/OR-tree graph.

An example implementation handling the output of the pile-up OR-tree 431 is shown in FIG. 5. In FIG. 5 the main OR-tree output 423 is passed to a raw histogram determiner 501. The raw histogram determiner 501 is configured to generate the raw histogram based on the main OR-tree output 423. For example, by the use of a number of digital counters. The raw histogram output 502 may then be passed to a histogram processor 505.

Furthermore a pile-up OR-tree output 433 is received by a pile-up determiner 503. The pile-up determiner 503 may comprise a counter configured to count the output of the pile-up OR-tree output 433 and a comparator coupled to the counter configured to compare the count of the pile-up OR-tree output with a determined threshold. As a slight pile up will produce a range error. The threshold determined based on the level of range error that can be tolerated. In some embodiments the threshold is chosen to be high enough that, in a mid to low average count scenario, the probability of passing the threshold 'incorrectly' due to photon statistics (many photons arriving in a burst) is very low. The output of the comparison between the pile-up OR-tree output count and the threshold can also be passed to the histogram processor 507 as a pile-up indicator or flag 504.

The histogram processor 505, having received the raw histogram output 502 and the pile-up indicator 504 can be configured to generate a suitable distance determination output 507 based on the pile-up indicator 504 and the raw histogram output 502.

Thus for example, in some embodiments the histogram processor 505 is configured to process the raw histogram output 502 to a suitable distance determination output where the pile-up indicator 504 indicates that the pile-up OR-tree counter values are less than the threshold value and therefore the zone is not being blinded by the ambient light value.

Furthermore in some embodiments the histogram processor 505 is configured to not process the raw histogram output 502 but to output a warning flag or signal where the pile-up indicator 504 indicates that the pile-up OR-tree counter values are greater than the threshold value and therefore the zone is being blinded by the ambient light value.

In some embodiments the histogram processor 505 is configured to output both the distance determination and the warning flag as outputs 507 and 509.

Figure 6:
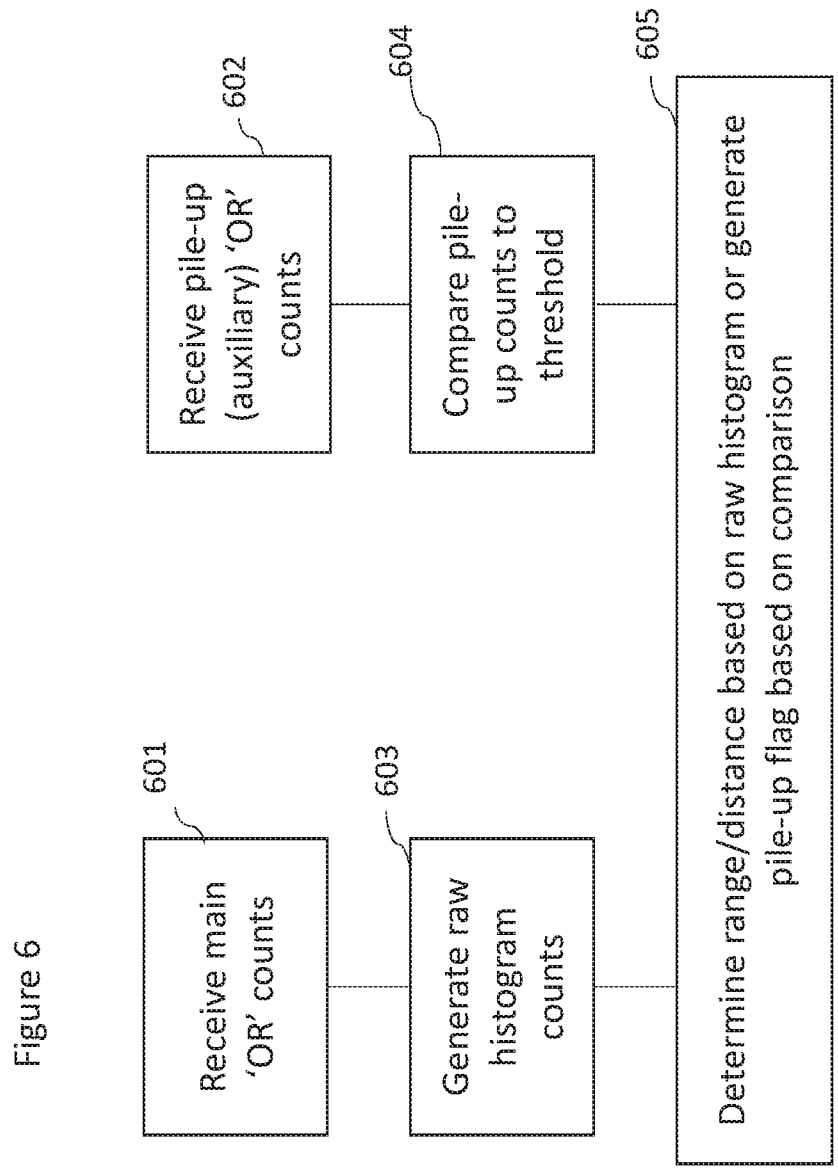
FIG. 6 shows a flow diagram of the operation of the example apparatus as shown in FIG. 5 according to some embodiments.

With respect to FIG. 6 an example flow diagram is shown summarizing the operations of the apparatus shown in FIG. 5.

The first operation that is that of receiving the main OR-tree count value as shown in FIG. 6 by step 601.

The parallel operation of receiving the pile-up OR-tree count value is shown in FIG. 6 by step 602.

Having received the main OR-tree count value the next operation is generating the raw histogram count values as shown in FIG. 6 by step 603.

Having received the received the pile-up OR-tree count value the next operation is comparing the pile-up OR-tree count value to a determined threshold as shown in FIG. 6 by step 604.

The following step is that of generating the distance value based on the raw histogram output and/or outputting a pile-up indicator based on the comparison output. This is shown in FIG. 6 by step 605.

It will be understood that the proximity sensors described above may be integrated in an apparatus such as a depth map camera, a mobile phone, a tablet computer, a desktop computer, a laptop computer, a video game console, a video door, a smart watch, automotive vehicles, etc.

Various embodiments with different variations have been described here above. It should be noted that those skilled in the art may combine various elements of these various embodiments and variations.

Such alterations, modifications, and improvements are intended to be part of this disclosure, and are intended to be within the scope of the claims. Accordingly, the foregoing description is by way of example only and is not intended to be limiting. The invention is limited only as defined in the claims and the equivalents thereto.

What is claimed is:

1. An apparatus for detecting pile-up within circuitry associated with photodetectors, the apparatus comprising:
   a plurality of photodetector outputs coupled to outputs of the photodetectors;
   a main OR-tree having a plurality of inputs coupled to the plurality of photodetector outputs and configured to combine the photodetector outputs to generate information for a histogram;
   a pile-up OR-tree in parallel with the main OR-tree, the pile-up OR-tree having a plurality of inputs coupled to the plurality of photodetector outputs and configured to combine the photodetector outputs;
   a counter configured to count an output of the pile-up OR-tree; and
   a comparator configured to compare an output of the counter to a determined threshold value, wherein the comparator is configured to output an indicator indicating pile-up within the circuitry associated with photodetectors based on the output of the counter being greater than or equal to the determined threshold value.

2. The apparatus as claimed in claim 1, wherein the photodetector outputs comprise:
   a plurality of avalanche diodes, each avalanche diode configured to generate a pulse on detecting a photon; and
   a plurality of comparators, each comparator associated with an avalanche diode and configured to sharpen a pulse generated by the associated avalanche diode.

3. The apparatus as claimed in claim 1, wherein the circuitry associated with the photodetectors comprises:
   a plurality of pulse shapers configured to shorten a pulse width of the photodetector outputs; and
   wherein the main OR-tree is configured to combine outputs of the pulse shapers.

4. The apparatus as claimed in claim 3, further comprising:
   a histogram determiner configured to generate count bin values for the histogram; and
   a histogram processor configured to receive the count bin values and an output of the comparator, wherein the histogram processor is configured to generate a distance based on the count bin values when the output of the comparator indicates an absence of pile-up within the circuitry associated with photodetectors.

5. The apparatus as claimed in claim 3, further comprising:
   a histogram determiner configured to generate count bin values for the histogram; and
   a histogram processor configured to receive the count bin values and an output of the comparator, wherein the histogram processor is configured to generate an indication that a distance based on the count bin values is inaccurate when the output of the comparator indicates pile-up within the circuitry associated with photodetectors.

6. The apparatus as claimed in claim 1, wherein the photodetectors are single photon avalanche diodes.

7. A method for detecting pile-up within circuitry associated with photodetectors, the method comprising:
   receiving a plurality of photodetector outputs at a main OR-tree and a pile-up OR tree in parallel with the main OR tree;
   combining, at the main OR-tree, the photodetector outputs to generate a main OR-tree output comprising information for a histogram;
   combining, at the pile-up OR tree, the photodetector outputs to generate a pile-up OR-tree output;
   counting the combining of the photodetector outputs;
   comparing the counting of the combining to a determined threshold value; and
   generating an indicator based on the comparing, wherein the indicator indicates pile-up within the circuitry associated with photodetectors when the counting of the combining is greater than or equal to the determined threshold value.

8. The method as claimed in claim 7, wherein receiving the photodetector outputs comprises:
   receiving outputs from a plurality of avalanche diodes configured to generate a pulse on detecting a photon; and
   receiving outputs from a plurality of comparators, each comparator associated with an avalanche diode and configured to sharpen a pulse generated by an associated avalanche diode.

9. The method as claimed in claim 7, wherein the circuitry associated with the photodetectors comprises:
   a plurality of pulse shapers configured to shorten a pulse width of the photodetector outputs; and
   wherein the main OR-tree is configured to combine outputs of the pulse shapers.

10. The method as claimed in claim 9, further comprising:
    generating, from the pile-up OR tree output, count bin values for the histogram; and
    generating a distance based on the count bin values when the indicator based on the comparing indicates an absence of pile-up within the circuitry associated with photodetectors.

11. The method as claimed in claim 9, further comprising:
generating, from the pile-up OR tree output, count bin values for the histogram; and
generating an indication that a distance based on the count bin values is inaccurate when the comparing indicates pile-up within the circuitry associated with photodetectors.

12. The method as claimed in claim 7, wherein the photodetectors are single photon avalanche diodes.

13. An apparatus for detecting pile-up within circuitry associated with photodetectors, the apparatus comprising:
means for receiving a plurality of photodetector outputs;
a main OR-tree having a plurality of inputs coupled to the plurality of photodetector outputs and configured to combine the photodetector outputs to generate information for a histogram;
a pile-up OR-tree in parallel with the main OR-tree, the pile-up OR-tree having a plurality of inputs coupled to the plurality of photodetector outputs and configured to combine the photodetector outputs to generate a pile-up OR-tree output;
means for counting the combining of the photodetector outputs from the pile-up OR-tree output;
means for comparing the counting to a determined threshold value; and
means for generating an indicator based on the comparing, wherein the indicator indicates pile-up within the circuitry associated with photodetectors when the counting is greater than or equal to the determined threshold value.

14. An apparatus comprising:
a plurality of avalanche diode comparators configured to output signals from an associated plurality of avalanche diodes;
a plurality of pulse shapers, each pulse shaper having an input coupled to an output of an associated avalanche diode comparator;
a main OR-tree having a plurality of inputs, each input of the main OR-tree being coupled to an output of an associated one of the pulse shapers;
a fast time to digital converter (TDC) having an input coupled to an output of the main OR-tree;
a pile-up OR-tree having a plurality of inputs, each input of the pile-up OR-tree being coupled to an output of an associated avalanche diode comparator;
a counter having an input coupled to an output of the pile-up OR-tree; and
a comparator having a first input coupled to an output of the counter and a second input coupled to a threshold signal node.

15. The apparatus as claimed in claim 14, wherein the comparator is configured to generate a flag when the output of the counter reaches a threshold value carried on the threshold signal node.

16. The apparatus as claimed in claim 14, further comprising a histogram processor coupled to receive information from the main OR-tree and from the pile-up OR-tree.

17. The apparatus as claimed in claim 16, further comprising:
a raw histogram determination circuit coupled between an output of the main OR-tree and the histogram processor; and
a pile-up histogram determination circuit coupled between an output of the pile-up OR-tree and the histogram processor.

18. The apparatus as claimed in claim 17, wherein the raw histogram determination circuit comprises a plurality of digital counters.

19. The apparatus as claimed in claim 17, wherein the histogram processor is configured to generate a distance determination output.

20. The apparatus as claimed in claim 17, wherein the histogram processor is configured to output both a distance determination output and a warning flag.

* * * * *